United States Patent
Park et al.

(10) Patent No.: US 7,672,182 B2
(45) Date of Patent: Mar. 2, 2010

(54) READ ASSIST CIRCUIT OF SRAM WITH LOW STANDBY CURRENT

(75) Inventors: Heechoul Park, San Jose, CA (US); Wilson Chin, Cupertino, CA (US); Kuan-Yu James Lin, San Jose, CA (US); Sanjaya Dharmasena, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 110 days.

(21) Appl. No.: 12/171,236

(22) Filed: Jul. 10, 2008

(65) Prior Publication Data

US 2010/0008171 A1 Jan. 14, 2010

(51) Int. Cl.
*G11C 11/00* (2006.01)
(52) U.S. Cl. ................. 365/203; 365/226
(58) Field of Classification Search ........... 365/203, 365/226
See application file for complete search history.

(56) References Cited

U.S. PATENT DOCUMENTS

| | | | |
|---|---|---|---|
| 6,859,385 B2 * | 2/2005 | Karlsson et al. ............ 365/154 |
| 6,876,595 B2 * | 4/2005 | Bhavnagarwala et al. ......... 365/230.03 |
| 6,963,103 B2 * | 11/2005 | Forbes .......... 257/315 |
| 7,020,041 B2 * | 3/2006 | Somasekhar et al. ......... 365/229 |
| 7,079,426 B2 * | 7/2006 | Zhang et al. ........... 365/189.02 |
| 7,242,609 B2 * | 7/2007 | Tokito .......... 365/154 |
| 7,295,459 B2 * | 11/2007 | Islam .......... 365/156 |
| 7,342,845 B2 * | 3/2008 | Somasekhar et al. ......... 365/229 |
| 7,359,275 B1 * | 4/2008 | Wu .......... 365/230.05 |
| 7,369,438 B2 * | 5/2008 | Lee .......... 365/185.17 |

\* cited by examiner

*Primary Examiner*—Michael T Tran
(74) *Attorney, Agent, or Firm*—Martine Penilla & Gencarella LLP

(57) ABSTRACT

A SRAM memory with a read assist circuit is presented. The read assist circuit uses bitline voltage level switches, which are connected to a low power supply and a high power supply. The bitline voltage level switches have a write operation state, a read operation state, and a standby operation state. The write operation state selectively provides the high power supply to bitlines in columns selected for a write operation, and provides the low power supply to bitlines in the remaining columns. The read operation state selectively provides the low power supply to bitlines in columns selected for the read operation, and provides the low power supply to bitlines in the other columns. The standby operation state selectively provides the low power supply to bitlines in all columns when not in the read operation state or the write operation state.

15 Claims, 4 Drawing Sheets

READ ASSIST CIRCUIT OF SRAM WITH LOW STANDBY CURRENT

BACKGROUND OF THE INVENTION

1. Field of the Invention

The present invention relates generally to semiconductor memory devices and more particularly to an improved SRAM design for stable SRAM performance and reduced power consumption.

2. Description of the Related Art

Historically, as circuit feature sizes are reduced and supply voltages are lowered, it has become increasingly difficult to achieve stable SRAM performance and design an SRAM cell that has both adequate static noise margin (SNM) and adequate trip voltage (Vtrip). The trip voltage (Vtrip) is a measure of the ability of a cell to write digital data into a SRAM cell.

The SNM quantifies the amount of voltage noise required at the internal nodes of the SRAM cell to flip the state of the digital data stored in the SRAM cell. The SNM may be determined graphically by plotting the voltage transfer curve of one of the inverters that comprises the latch of the SRAM cell and inverting the transfer curve of the other inverter. The voltage difference between the two voltage transfer curves is the SNM.

For SRAM cells in general, SNM and Vtrip are interdependent and design techniques that improve SNM, tend to degrade Vtrip and vice-versa. For example, if the passgate transistor is too strong relative to the drive transistor, SNM is degraded. If the pass gate is too weak relative to the drive transistor, Vtrip is degraded. The SNM can be improved by decreasing the voltage on the bitline, which weakens the passgate transistor. The SNM improves linearly with decreasing bitline voltage until the bitline voltage is about equal to the threshold voltage of the passgate transistor. Thus, SRAM design has become a delicate balance of the relative strengths of the passgate, drive, and load transistors.

It is within this context that embodiments of the claimed invention arise.

SUMMARY OF THE INVENTION

Broadly speaking, the present invention fills these needs by providing a method and apparatus for a read assist circuit for SRAMs with low standby current. It should be appreciated that the present invention can be implemented in numerous ways, including as a method, a system, or a device. Several inventive embodiments of the present invention are described below.

In accordance with one aspect of the invention, a SRAM memory with a read assist circuit is detailed. A memory array is defined by rows and columns of SRAM cells with wordlines for accessing selected rows through a passgate and bitlines for accessing selected columns. The read assist circuit uses a plurality of bitline voltage level switches which are connected to a low power supply and a high power supply. The bitline voltage level switches have a write operation state, a read operation state, and a standby operation state. The write operation state selectively provides the high power supply to bitlines in columns selected for a write operation, and provides the low power supply to bitlines in the remaining columns. The read operation state provides the low power supply to bitlines in all columns. The standby operation state is defined to selectively provide the low power supply to bitlines in all columns when not in the read operation state or the write operation state.

In accordance with another aspect of the invention, a method of setting power supply configuration during writing or reading digital data to SRAM memory cells using reduced bitline voltage is detailed. Columns are selected for a read or write operation state using output signals from the column decoder. One of two power supplies is provided to bitlines through a plurality of bitline voltage level switches. The low power supply is provided to bitlines during the read operation state and selectively to bitlines in columns not selected for the write operation. The high power supply is provided selectively to bitlines in columns identified for the write operation state. After the read or write operation state, the bitlines are precharged using the low power supply until the next read or write operation state.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

FIG. 2 illustrates embodiments of the logic circuitry for the write enable switch, the bitline voltage level switch, and the column selection switch in accordance with one embodiment of the present invention.

DETAILED DESCRIPTION

Figure 1A:
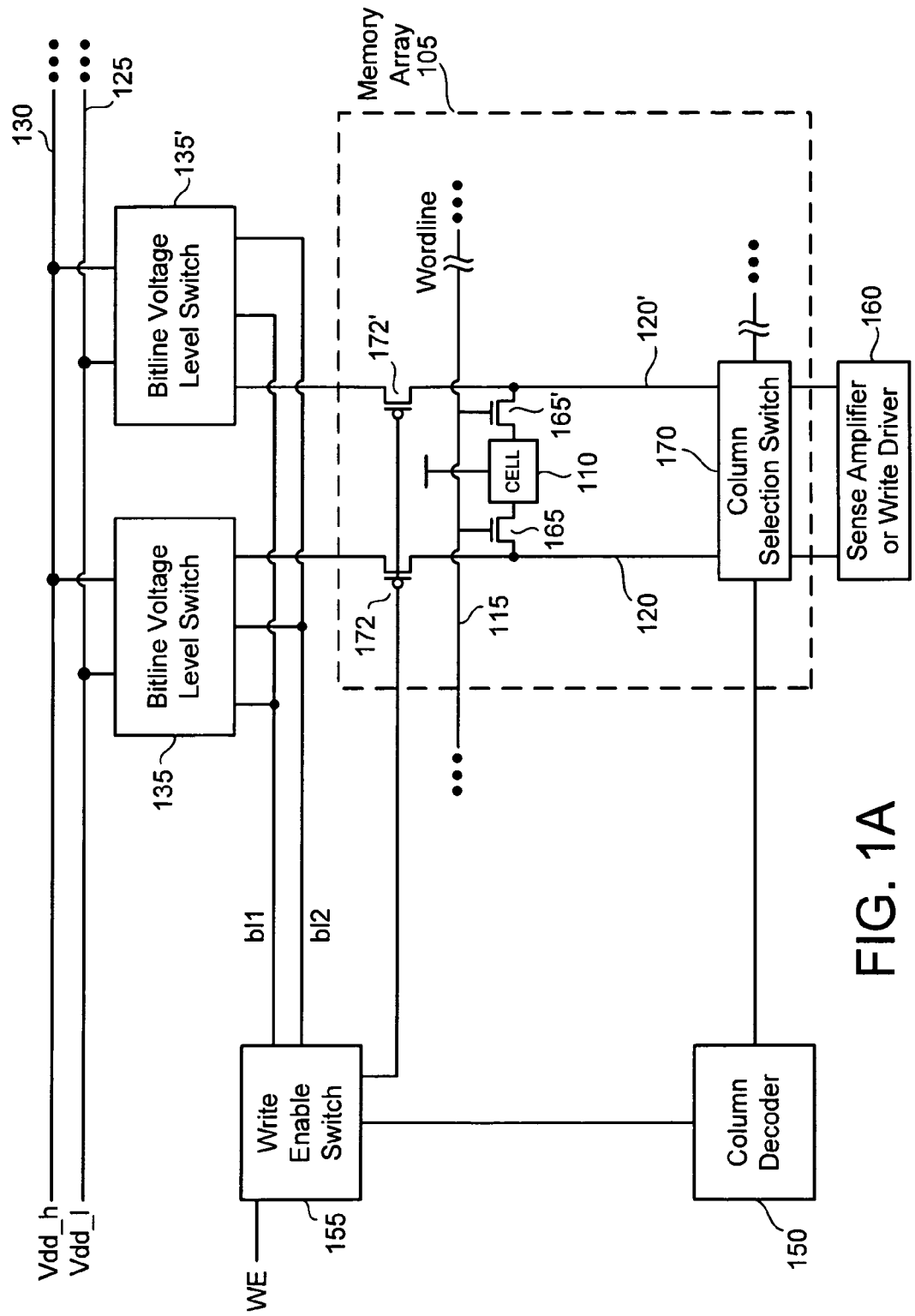
FIG. 1A illustrates a SRAM memory array implementing write and read assist circuitry with reduced bitline voltage during standby in accordance with one embodiment of the present invention.

The following embodiments describe an apparatus and method for reading and writing data into a memory array with reduced standby current. It will be obvious, however, to one skilled in the art, that the present invention may be practiced without some or all of these specific details. In other instances, well known process operations have not been described in detail in order not to unnecessarily obscure the present invention.

One design technique to improve the static noise margin during the read operation is reducing the power supply voltage to the bitlines 120 and 120'. The voltage on the bitlines 120 and 120' should be high during a write operation to not adversely effect the Vtrip margin. In addition to improving SNM, reducing the voltage on bitlines 120 and 120' during standby operation reduces the standby current of the memory array 105. The SNM improves as the voltage on the bitlines 120 and 120' is reduced until the voltage on the bitlines 120 and 120' is comparable to the threshold voltage of the passgate transistors 165 and 165'. Implementation of the claimed design technique uses two power supply voltages 125 and 130, selectively applied to the bitlines 120 and 120' during read and write operations. Bitline voltage level switches 135 and 135' are used to control which power supply is provided to the selected bitlines 120 and 120'.

FIG. 1A illustrates a SRAM memory array 105 implementing write and read assist circuitry with reduced bitline voltage during standby in accordance with one embodiment of the present invention. Generally speaking, the SRAM circuit controls the reading and writing of digital data into the memory array 105 using a reduced bitline 120 and 120' voltage during read and standby operation.

The SRAM memory array 105 is composed of SRAM cells 110 arrayed in a grid of rows and columns. For the purpose of clarity, only one of SRAM cells 110 of the memory array 105 is illustrated. Rows of SRAM cells 110 are accessed using a wordline 115 that couples to the passgates 165 and 165', which connect SRAM cells 110 to selected columns of SRAM cells 110, through the bitlines 120 and 120'.

The SRAM circuit uses two distinct power supplies, a low power supply 125 and a high power supply 130. The low power supply 125 provides a low power supply voltage to the bitlines 120 and 120' for precharging the bitlines 120 and 120' before the write operation or read operation, as well as during standby operation when neither write nor read operation is performed. The high power supply 130 provides the power supply to the bitlines 120 and 120' during the write operation in columns identified for the write operation to occur.

The bitline voltage level switches 135 and 135' are connected to the power supplies 125 and 130. The bitline voltage level switches 135 and 135' have two distinct operating states, a write operation state and a read operation state. During the read operation state, the bitline voltage level switches 135 and 135' provide the low power supply 125 to bitlines 120 and 120' in selected columns identified for the read operation to occur and for columns not identified for the read operation to occur.

During the write operation state, the bitline voltage level switches 135 and 135' selectively provide the high power supply 130 to the bitlines 120 and 120' in columns selected by the column decoder 150. In addition, the bitlines 120 and 120' in columns that are not identified for the write operation are provided the low power supply 125 during the write operation state.

A column decoder 150 identifies columns selected for the read or write operation state. The column decoder 150 transmits a signal to a write enable switch 155, as well as transmitting a signal to the column selection switch 170 to couple the bitlines 120 and 120' to the sense amplifier or write driver 160.

The write enable switch 155 is connected to the bitline voltage level switches 135 and 135', and the column decoder 150. The write enable switch 155 generates output signals bl1 and bl2, which direct the bitline voltage level switches 135 and 135' to provide the low power supply 125 and/or high power supply 130 to the bitlines 120 and 120' based on the write or read operation state of the selected column(s). When a write operation is enabled, the write enable switch 155 receives an active high signal at the WE input. In addition, the write enable switch 155 transmits the input from the column decoder 150 to PMOS transistors 172 and 172' decouple the bitlines 120 and 120' from the bitline voltage level switches 135 and 135' when the column decoder 150 selects a column for either the read operation state or write operation state.

The column selection switch 170 is connected to the column decoder 150, the sense amplifier or write driver 160 and the bitlines 120 and 120'. The column selection switch 170 receives the y0 output from the column decoder 150. When the column decoder 150 selects a column, the column selection switch 170 couples either the sense amplifier or write driver 160 to the bitlines 120 and 120', depending on if the write operation state or read operation state has been identified.

Figures 1, 1B:
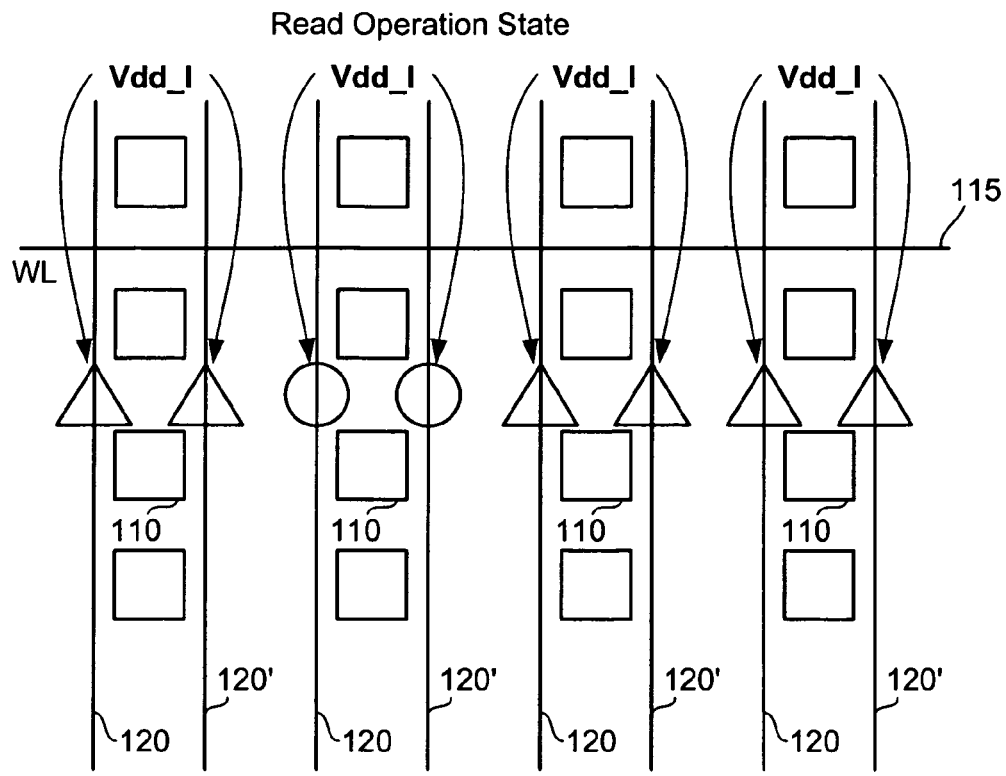
FIGS. 1B-1 and 1B-2 illustrate the read and write operations' state bias conditions of bitlines in a selected column in accordance with one embodiment of the present invention.

FIG. 1B-1 illustrates the read operation state bias condition of bitlines 120 and 120' in a selected column in accordance with one embodiment of the present invention. For this simple example, selected bitlines are identified by an oval and unselected bitlines are noted by a triangle. During the read operation state, the bitlines 120 and 120' of the selected row are provided the low power supply 125 (Vdd_l), regardless whether the column is selected or unselected.

Figures 1, 1B, 2:
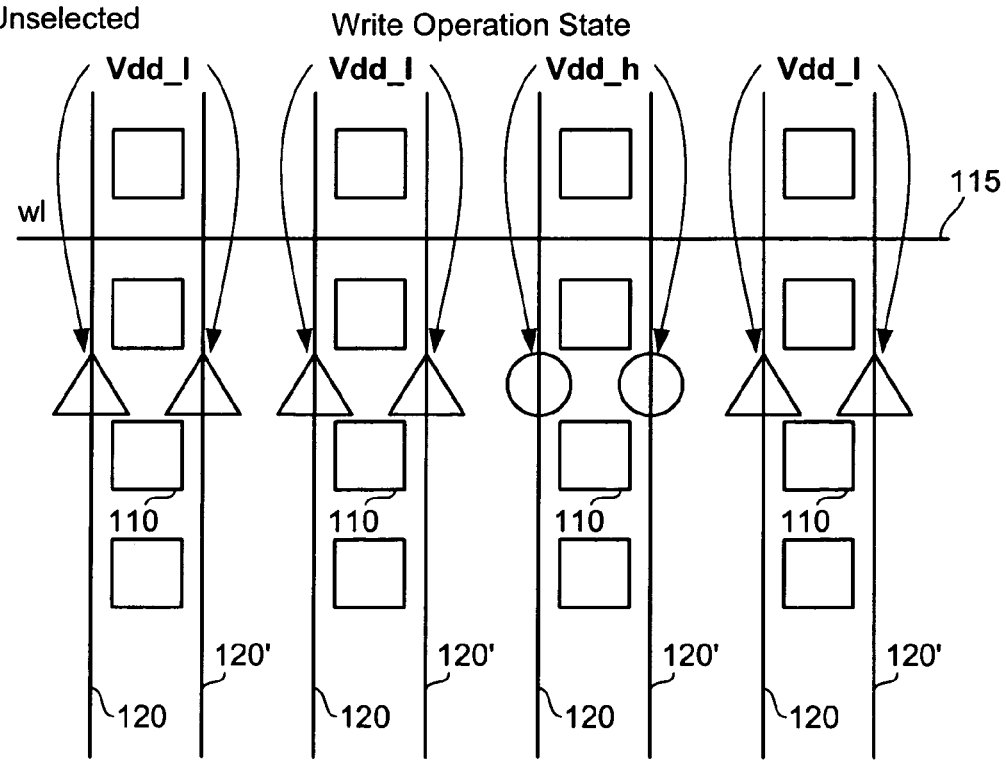
Figure 2:
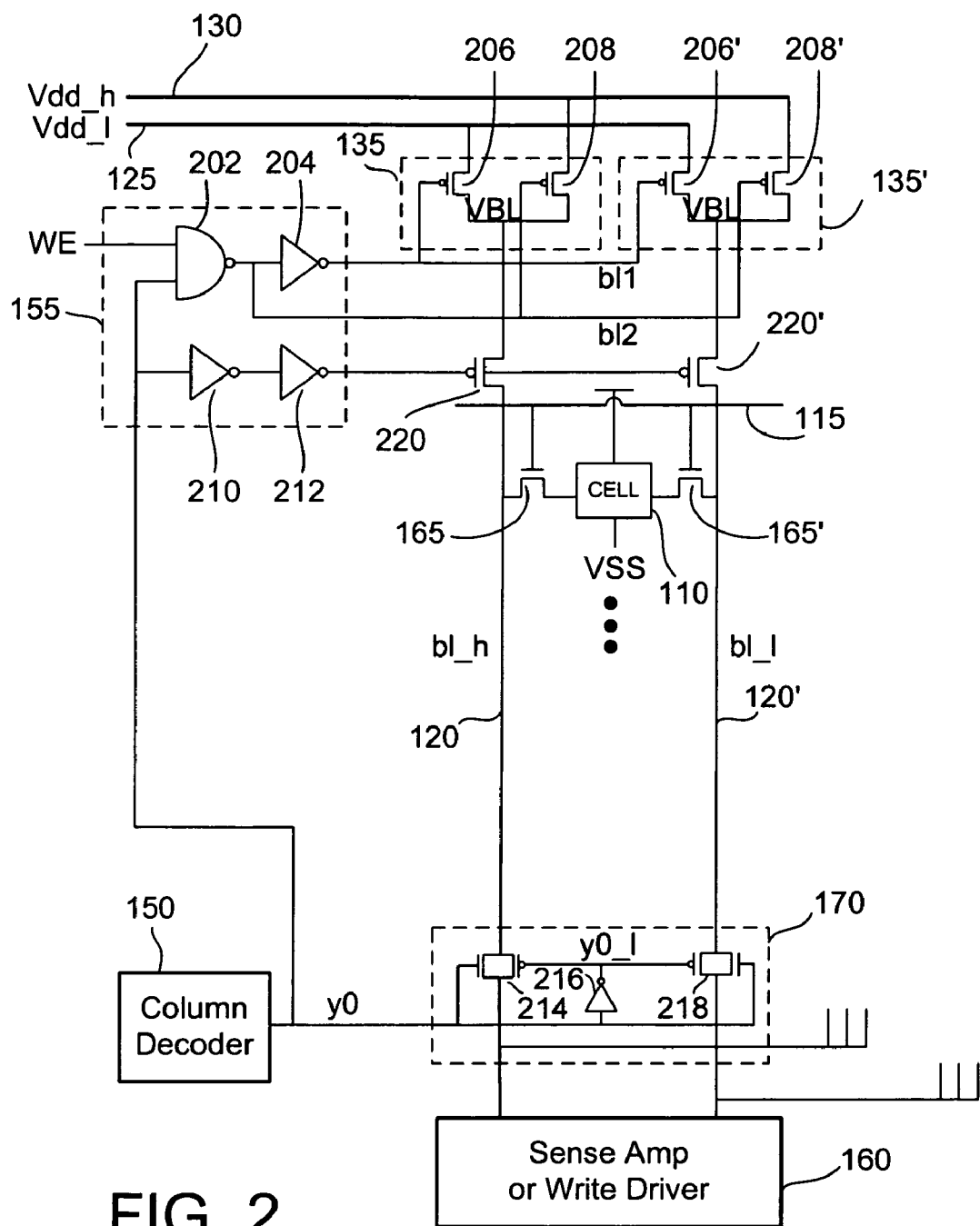

FIG. 1B-2 illustrates the write operation state bias condition of the bitlines 120 and 120' in selected columns in accordance with one embodiment of the present invention. During the write operation state, the bitlines 120 and 120' of the selected column(s) are provided the high power supply 130 (Vdd_h), if the bitlines 120 and 120' are in a column selected for the write operation state by the column decoder 150. If the bitlines 120 and 120' are not in columns identified for the write operation state, these SRAM cells 110 are provided the low power supply 130 (Vdd_l).

FIG. 2 illustrates embodiments of the logic circuitry for the write enable switch 155, the bitline voltage level switches 135 and 135', and the column selection switch 170 in accordance with one embodiment of the present invention. The following description of the figure illustrates a specific embodiment of logic gates, switches and transistors. It should be noted other circuitry, logic gates, transistors, etc may be used to implement these circuit elements, so long as the logic functionality and the essential function of providing the low power supply 125 and the high power supply 130 to the bitlines 120 and 120' at the proper time is maintained.

In one embodiment of the write enable switch 155, the logic used by the write enable switch 155 to generate the output signals, bl1 and bl2, is a NAND gate 202 coupled to the input of an inverter 204. One input to the NAND gate 202 is the WE input and the other input to the NAND gate 202 is y0 output from the column decoder 150. When both the WE and the y0 output to the NAND gate 202 are high, the output from the NAND gate 208, bl2, is low. For all other combinations of input values of WE and y0, the output from the NAND gate 202, bl2, is high. The output from the NAND gate 202, bl2, is coupled to the inverter 204 to generate the output signal bl1. The output signal bl1 is high only when both the WE and the y0 input to the NAND gate 202 are high.

In another embodiment of the write enable switch 155, the logic used by the write enable switch 155 to generate the input signal to PMOS transistors 172 and 172' is two inverters 210 and 212. The input to the inverter 210 is the y0 output from the column decoder 150. The output of inverter 210 is the input to the inverter 212, which is coupled to the gates of PMOS transistors 172 and 172'. When the column is selected for either the read operation state or the write operation state, the y0 output from the column decoder 150 is high, which decouples the bitlines 120 and 120' from the bitline voltage level switches 135 and 135'. Decoupling the bitlines 120 and 120' from the bitline voltage level switches 135 and 135' discontinues the precharge operation on the bitlines 120 and 120' during the read operation state or the write operation state.

Although specific logic gates were used to illustrate one embodiment of the write enable switch 155, one with skill in the art will appreciate other logic configurations can be used so long as the essential functions of triggering the switching of the high power supply 130 and the low power supply 125 at the proper time, as well as decoupling the bitlines 120 and 120' from the bitline voltage level switches 135 and 135' are maintained.

In one embodiment of the bitline voltage level switches 135 and 135', each cell voltage level switch 135 and 135' is formed using two PMOS transistors, 206 and 208 (or 206' and 208'), with the one output terminal from each transistor, 206 and 208 (or 206' and 208'), coupled to node VBL. The remaining output terminal of transistor 206 (or 206') is coupled to the low power supply 125 and the remaining output terminal of transistor 208 (or 208') is coupled to the high power supply 130. The input terminal of transistor 206 (or 206') is coupled to the bl1 output from the write enable switch 155 and the input terminal of transistor 208 (or 208') is coupled to the bl2 output from the write enable switch 155. Although specific logic gates were used to illustrate one embodiment of the bitline voltage level switches 135 and 135', one with skill in the art will appreciate alternative embodiments can be used so long as the essential function of providing the low power supply 125 and the high power supply 130 to the bitlines 120 and 120' at the proper time is maintained.

When the output signal bl2 from the write enable switch 155 is low, the high power supply 130 is provided to node VBL. This occurs when both the WE input and the y0 output from the column decoder 150 are both high. The output signal bl1 from the write enable switch 155 is high when the output signal bl2 is low, which turns off transistor 206 (or 206'). The result is the high power supply voltage 130 is provided to the bitlines 120 and 120' in column(s) selected for the write operation state.

Conversely, when the output bl1 from the write enable switch 155 is low, the low power supply 125 is provided to the bitlines 120 and 120' through transistor 206 (or 206'). This occurs whenever both the WE input and the y0 output from the column decoder 150 are both not high. In other words, the low power supply 125 is provided to the bitlines 120 and 120' during the read operation or when a column is not selected for the write operation by the column decoder 150.

In one embodiment of the column selection switch 170, the column selection switch 170 is implemented using two transmission gates 214 and 218. One output terminal of transmission gate 214 is connected to bitline 120 and the remaining output terminal of the transmission gate 214 is coupled to the sense amplifier or write driver 160. One output terminal of transmission gate 218 is connected to bitline 120' and the remaining output terminal of the transmission gate 218 is coupled to the sense amplifier or write driver 160. The NMOS input for transmission gates 214 and 218 is coupled to the y0 output of the column decoder 150. The PMOS input for transmission gates 214 and 218 is coupled to the output of inverter 216. The input of inverter 216 is connected to y0 output of the column decoder 150.

When the y0 output to transmission gates 214 and 218 are high, the NMOS transistors in transmission gates 214 and 218 turn on. The y0 input to the inverter 216 goes high, which leads to low on the output of the inverter 216. When the output of the inverter 216 is low, the PMOS transistors in transmission gates 214 and 218 turn on. As a result, bitlines 120 and 120' are coupled to the sense amplifier or write driver 160 when the column is selected.

Figure 3A:
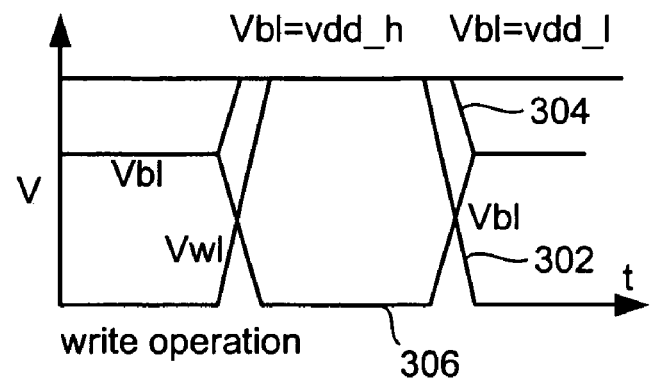
FIG. 3A illustrates exemplary timing of the write operation state of the SRAM write and read assist circuit with reduced bitline voltage in accordance with one embodiment of the present invention.

FIG. 3A illustrates exemplary timing of the write operation state of the SRAM write and read assist circuit with reduced bitline voltage in accordance with one embodiment of the present invention. While the memory array 105 is in the standby mode, which is between any read or write operation state, the bitlines 120 and 120' are provided the low power supply 125. Prior to coupling the SRAM cells 110 to the bitlines 120 and 120', the WE output from the write enable switch 155 and the y0 output from the column decoder 150 are high for columns identified for the write operation state. It should be noted, the timing of WE and the y0 output from the column decoder 150 going from low to high is not critical, so long as it is prior to the wordline input 302, Vwl, going high. The bitline voltage level switches 135 and 135' provide the high power supply 130 to the bitlines 120 and 120' in columns identified for the write operation.

When the wordline input 302, Vwl, to the passgates 165 and 165' goes high, the SRAM cells 110 are coupled to the bitlines 120 and 120'. For columns identified for the write operation, the column selection switch 170 couples the bitlines 120 and 120' to the write driver 160. In one embodiment, to write a digital 1 to the SRAM cells 110, the voltage 304 on the bitline 120 is high, while the voltage 306 on the bitline 120' is low. The write driver 160 will maintain the high power supply 130 to the bitline 120 and provide logic 0 to the bitline 120'.

Alternatively, a digital 1 may be written to the SRAM cells 110 by setting the voltage on the bitline 120 low and setting the voltage on the bitline 120' high.

Figure 3B:
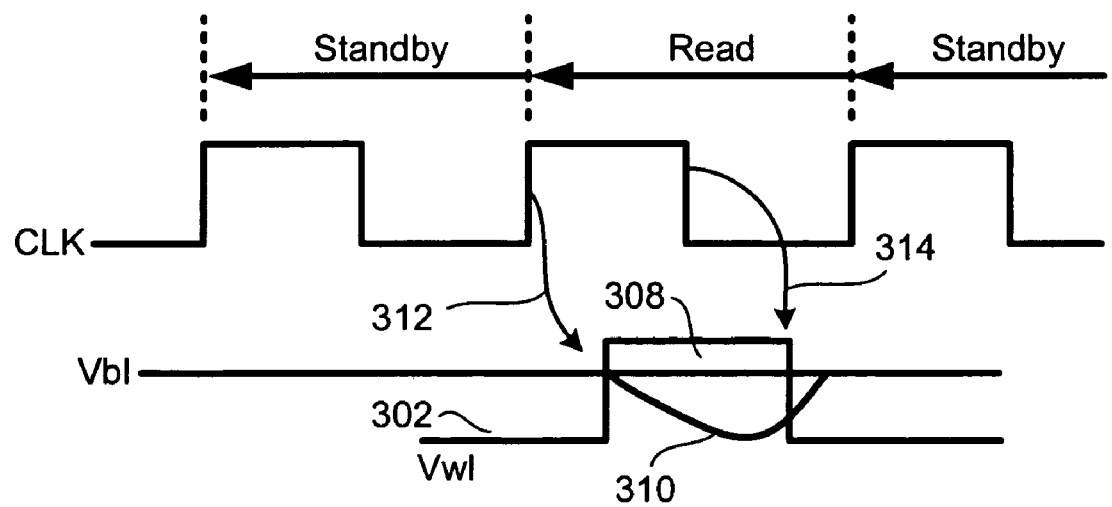
FIG. 3B illustrates exemplary timing of the standby operation state and read operation state of the SRAM write and read assist circuit with reduced bitline voltage over a period of three clock cycles in accordance with one embodiment of the present invention.

FIG. 3B illustrates exemplary timing of the standby operation state and read operation state of the SRAM write and read assist circuit with reduced bitline voltage over a period of three clock cycles in accordance with one embodiment of the present invention. Prior to the read operation state, the memory array 105 is in the standby operation state and the bitlines 120 and 120' are provided the low power supply (vdd_l) 125. In one embodiment, as the CLK input begins the next clock cycle 312, the memory array 105 transitions to the read operation state. The WE output from the write enable switch 155 is low, while the y0 output from the column decoder 150 is high for the identified columns prior to coupling the SRAM cells 110 to the bitlines 120 and 120'. It should be noted, the timing of when the WE input is low and when the y0 output from the column decoder 150 transitions from low to high is not critical, so long as it is prior to the wordline input 302, Vwl, going high.

When the wordline input 302, Vwl, to the passgates 165 and 165' goes high, the SRAM cells 110 are coupled to the bitlines 120 and 120'. For columns identified for the read operation, the column selection switch 170 couples the bitlines 120 and 120' to the sense amplifier 160. In one embodiment, a digital 1 in the SRAM cells 110 is read out when the voltage 308 on bitline 120 is high and the voltage 310 on the bitline 120' is low. The voltage 308 on the bitline 120 remains at vdd_l, while the voltage 310 on the bitline 120' drops below vdd_l. If a logic 0 is stored in SRAM cells 110, the voltage 308 coupled to the bitline 120 from the SRAM cells 110 is high and voltage 310 coupled to the bitline 120' is low. The sense amplifier 170 reads the voltage 308 on the bitline 120 and the voltage 310 on the bitline 120'. At the end of the read operation state 314, the bitlines 120 and 120' are provided the low power supply 125 reverting back to the standby operation state.

Alternatively, a digital 1 may be read from the SRAM cells 110 when the voltage on the bitline 120 is low and the voltage on the bitline 120' is high.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:
   (a) a memory array defined by SRAM cells, the memory array having rows and columns, and wordlines for accessing selected rows through a passgate and bitlines for accessing selected columns;
   (b) a plurality of bitline voltage level switches connected to a low power supply and a high power supply, the bitline voltage level switches having,
      (i) a write operation state defined to selectively provide the high power supply to bitlines in columns in which a write operation is to occur, and provide the low power supply to bitlines in columns in which the write operation is not identified to occur;
      (ii) a read operation state defined to selectively provide the low power supply to bitlines in columns in which a read operation is to occur, and provide the low power supply to bitlines in columns in which the read operation is not identified to occur;
   (c) a column decoder for identifying columns selected for the read or write operation state; and
   (d) a write enable switch connected to the bitline voltage level switches, and the column decoder.

2. A memory circuit of claim 1, wherein the bitline voltage level switches have a standby operation state defined to selectively provide the low power supply to bitlines in all columns when not in the read operation state or the write operation state, thereby reducing standby current.

3. A memory circuit of claim 2, further comprising:
   (e) a sense amplifier and write driver circuit coupled to each of the bitlines of the memory array.

4. A memory circuit of claim 3 wherein the sense amplifier defined to magnify a digital value stored in the SRAM cells exposed to the read operation state.

5. A memory circuit of claim 3 wherein the write driver defined to apply voltage levels to the bitlines of the memory array to define a digital value to store in the SRAM cells exposed to the write operation state.

6. A method of setting power supply configuration during writing or reading digital data to SRAM memory cells using reduced bitline voltage, comprising the steps of:
   (a) selecting column(s) in which a read or write operation state is identified to occur, using output from the column decoder;
   (b) providing a power supply to bitlines through a plurality of bitline voltage level switches,
      (i) the low power supply selectively to bitlines in columns in which a read operation state is to occur, and selectively provide the low power supply to bitlines in columns in which the read operation state is not identified to occur;
      (ii) the high power supply selectively to bitlines in columns in which a write operation state is to occur; and
      (iii) the low power supply selectively to bitlines in columns in which the write operation state is not identified to occur.

7. The method of claim 6 further comprising the step of:
   (c) accessing SRAM cells in which a read or write operation state is identified to occur, using a wordline to turn on a passgate,
      (i) writing digital data into the SRAM cells in which the write operation state is to occur; and
      (ii) reading digital data from SRAM cells in columns in which the read operation state is to occur.

8. The method of claim 7 further comprising the step of:
   (d) precharging the bitlines after a read or write operation state.

9. The method of claim 8 wherein precharging the bitlines after a read or write operation state provides the low power supply to the bitlines until the next read or write operation state, thereby reducing the standby current during the standby operation state.

10. The method of claim 7 wherein writing data to SRAM cells using a write driver circuit applying voltage levels to the bitlines of the memory array to define a digital value to store in the SRAM cells exposed to the write operation state.

11. The method of claim 7 wherein reading data stored in the SRAM cells using a sense amplifier to magnify a digital value exposed to the read operation state.

12. A method of writing or reading digital data to SRAM memory cells using reduced bitline voltage, comprising the steps of:
   (a) selecting column(s) in which a read or write operation is identified to occur, using output from the column decoder;
   (b) providing a power supply to bitlines through a plurality of bitline voltage level switches,
      (i) the low power supply selectively to bitlines in columns in which a read operation is to occur, and selectively provide the low power supply to bitlines in columns in which the read operation is not identified to occur;
      (ii) the high power supply selectively to bitlines in columns in which a write operation is to occur;
      (iii) the low power supply selectively to bitlines in columns in which the write operation is not identified to occur;
   (c) accessing SRAM cells in which a read or write operation is identified to occur, using a wordline to turn on a passgate;
      (i) writing digital data into the SRAM cells in which the write operation is to occur;
      (ii) reading digital data from SRAM cells in columns in which the read operation is to occur; and
   (d) precharging the bitlines after a read or write operation.

13. The method of claim 12 wherein precharging the bitlines after a read or write operation state provides the low power supply to the bitlines until the next read or write operation state, thereby reducing the standby current during the standby operation state.

14. The method of claim 12 wherein writing data to SRAM cells using a write driver circuit applying voltage levels to the bitlines of the memory array to define a digital value to store in the SRAM cells exposed to the write operation state.

15. The method of claim 12 wherein reading data stored in the SRAM cells using a sense amplifier to magnify a digital value exposed to the read operation state.

* * * * *